United States Patent
Watanabe et al.

(10) Patent No.: US 7,130,715 B2
(45) Date of Patent: Oct. 31, 2006

(54) MACHINING METHOD AND MACHINING APPARATUS

(75) Inventors: Kazuo Watanabe, Ebina (JP); Takahiko Yamashita, Ebina (JP); Yasushi Ito, Ebina (JP); Katsuhiro Nagasawa, Ebina (JP)

(73) Assignee: Hitachi Via Mechanics Ltd., Ebina (JP)

( * ) Notice: Subject to any disclaimer, the term of this patent is extended or adjusted under 35 U.S.C. 154(b) by 160 days.

(21) Appl. No.: 10/679,408

(22) Filed: Oct. 7, 2003

(65) Prior Publication Data

US 2004/0128816 A1    Jul. 8, 2004

(51) Int. Cl.
*G06F 19/00* (2006.01)

(52) U.S. Cl. .................... 700/193; 700/192; 700/176; 700/160

(58) Field of Classification Search ................ 700/159, 700/160, 175, 176, 186, 192–194
See application file for complete search history.

(56) References Cited

U.S. PATENT DOCUMENTS

| | | | | |
|---|---|---|---|---|
| 4,409,650 A | * | 10/1983 | Noguchi | 700/88 |
| 5,189,352 A | * | 2/1993 | Hamaya | 318/569 |
| 5,523,953 A | * | 6/1996 | Araie et al. | 700/193 |
| 5,931,070 A | * | 8/1999 | Miyajima et al. | 83/39 |
| 6,456,896 B1 | * | 9/2002 | Ito et al. | 700/193 |
| 6,501,997 B1 | * | 12/2002 | Kakino | 700/28 |

FOREIGN PATENT DOCUMENTS

| JP | 05-301198 | 11/1993 |
|---|---|---|
| JP | 11305819 A | 11/1999 |
| JP | 2002166386 A | 6/2002 |

* cited by examiner

Primary Examiner—Albert W. Paladini
Assistant Examiner—Sean Shechtman
(74) Attorney, Agent, or Firm—Crowell & Moring LLP (57) ABSTRACT

In a machining method and a machining apparatus, prior to machining, an NC control unit makes an X-axis drive unit move a table based on examination conditions specified in advance. Thus, the NC control unit obtains a stabilization time required from the command-reach time of a poisoning command and till the stabilization of position response of the table within a predetermined allowable range. Likewise, for moving a drill in a Y-axis direction, the NC control unit obtains a stabilization time required till the stabilization of position response within a predetermined allowable range. At the time of machining, the drill is moved in a Z-axis direction to cut into a printed wiring board as soon as the obtained stabilization time has passed.

19 Claims, 11 Drawing Sheets

MACHINING METHOD AND MACHINING APPARATUS

BACKGROUND OF THE INVENTION

1. Field of the Invention

The present invention relates to a machining method and a machining apparatus in which a table mounted with a work and a main shaft holding a tool are moved relatively to each other in X-, Y- and Z-directions perpendicular to one another for machining the work with the tool.

2. Description of the Related Art

Figure 8:
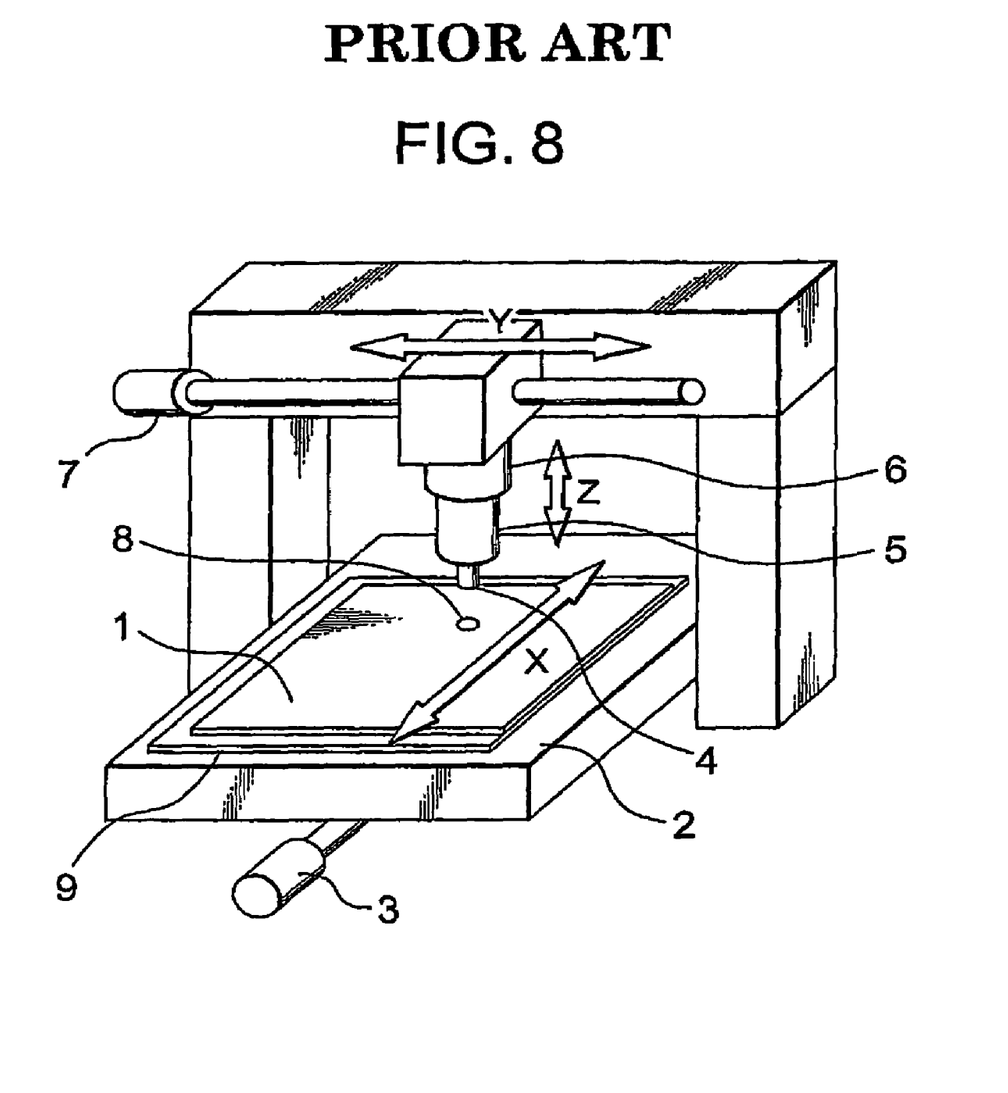
FIG. 8 is a configuration diagram of a printed board machining apparatus used in the related art.

FIG. 8 is a configuration diagram of a printed wiring board machining apparatus used conventionally. In FIG. 8, a printed wiring board 1 is fixed to the top of a table 2 with an underplate 9. The table 2 can be moved desirably in the front/rear (X) direction by an X-axis drive unit 3. A spindle 5 holding a drill 4 can be moved desirably in the up/down (Z) direction by a Z-axis drive unit 6. The Z-axis drive unit 6 can be moved desirably in the left/right (Y) direction by a Y-axis drive unit 7. Each of the X-, Y- and Z-axis drive units 3, 7 and 6 has a not-shown position detector, so that the drive unit can be positioned accurately in a specified position (coordinates) by feedback control.

At the time of machining, the X-axis drive unit 3 and the Y-axis drive unit 7 are operated so that the axis of the drill 4 is positioned on the axis (perpendicular to the printed wiring board 1) of a drilling position 8. After that, the spindle 5 is moved down to a specified height by the Z-axis drive unit 6, and the printed board 1 is drilled at an aimed position. When drilling finishes, the spindle 5 is lifted up, and the drill 4 is brought back to its standby position. Then, the aforementioned operation is repeated till machining is terminated. Therefore, the machining time is calculated as the sum of the X/Y-direction movement time and the Z-direction movement time.

The standby position of the drill 4 is defined as a position where the forward end of the drill 4 is at a predetermined distance from the surface of the printed wiring board 1 in order to discharge swarf surely and prevent the drill 4 from interfering with the printed wiring board 1 when the drill 4 moves horizontally. The distance from the forward end of the drill 4 to the surface of the printed wiring board 1 in the standby position is called an air-cut distance La. The value of the air-cut distance La is often determined based on experience. This value determined based on experience corresponds to the aforementioned predetermined distance.

Figure 9:
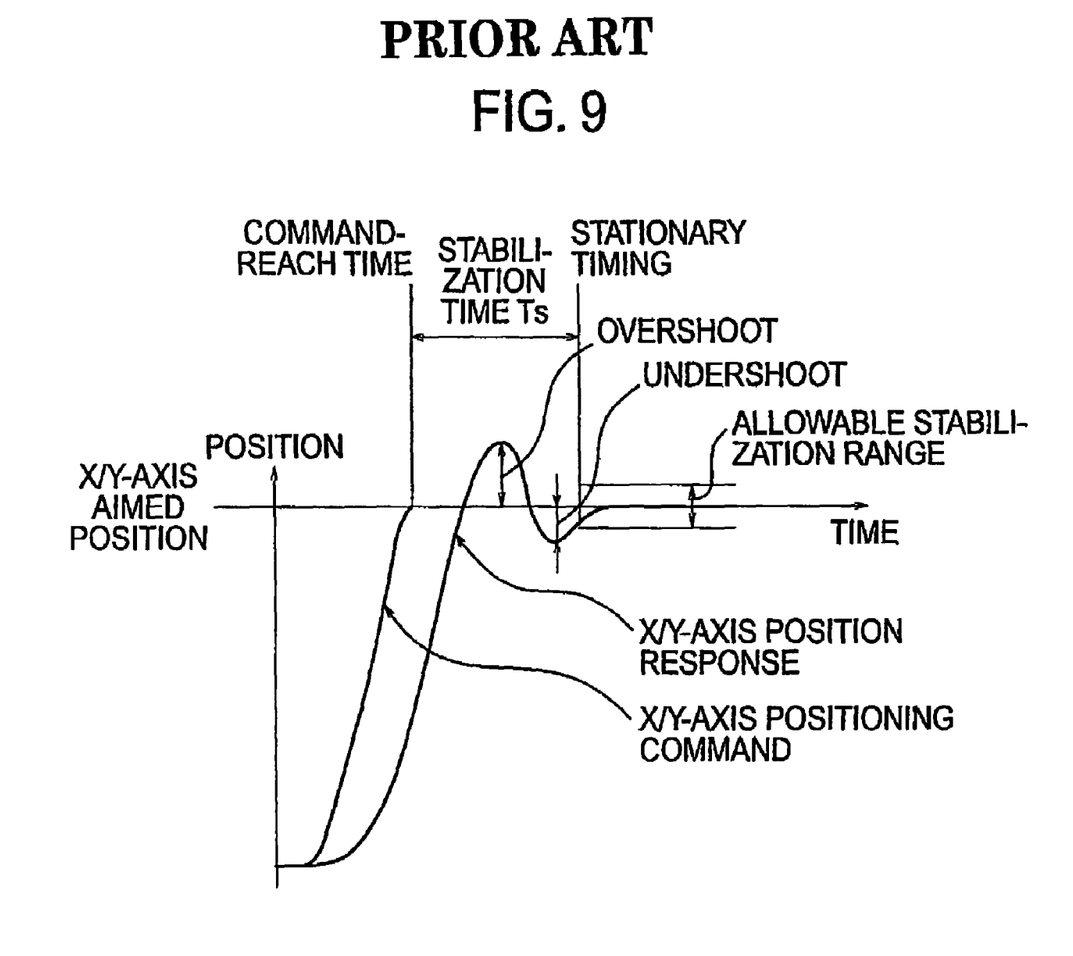
FIG. 9 is a diagram showing the relationship between a movement position instruction and a real position of an X-axis drive unit.
Figure 10:
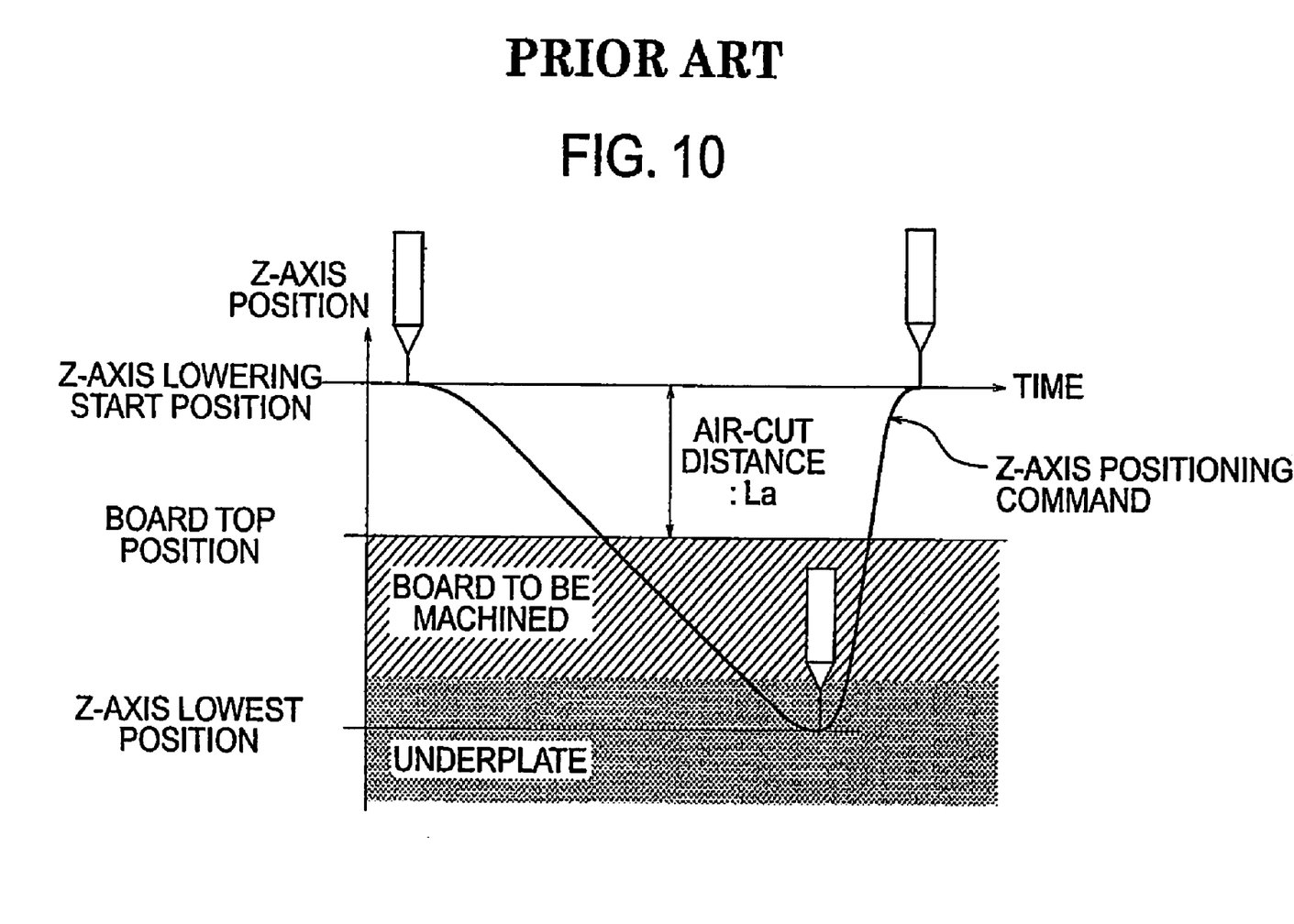
FIG. 10 is a diagram showing the relationship between a movement position instruction and a real position of a Z-axis drive unit.

FIG. 9 is a diagram showing the relationship between a positioning command and a real position (response) of the X-axis drive unit 3 with the abscissa designating the temporal axis. FIG. 10 is a diagram showing the relationship between a poisoning command and a real position (response) of the Z-axis drive unit 6 likewise.

As shown in FIG. 9, the position response of the X-axis drive unit 3 delays with respect to the X-axis positioning command. In addition, at the time of stopping, the position response oscillates (overshoots or undershoots) with respect to an aimed position, and the X-axis drive unit 3 approaches the aimed position gradually. The time required since the X-axis positioning command reached the aimed position and till the X-axis drive unit 3 is stabilized within a predetermined allowable position error range is referred to as a stabilization time Ts. On the other hand, the operation of the Y-axis drive unit 7 is similar to that of the X-axis drive unit 3.

On the other hand, as shown in FIG. 10, due to a lighter load on the Z-axis drive unit 6 than that on the X-axis drive unit 3, the delay (position deviation) of the position response of the Z-axis drive unit 6 with respect to the Z-axis poisoning command is smaller than that of the X-axis drive unit 3. In addition, the acceleration time of the Z-axis drive unit 6 is shorter. Thus, the Z-axis drive unit 6 lowers down substantially at a velocity specified as machining conditions, and rises up at a maximum velocity as soon as drilling finishes.

Figure 11:
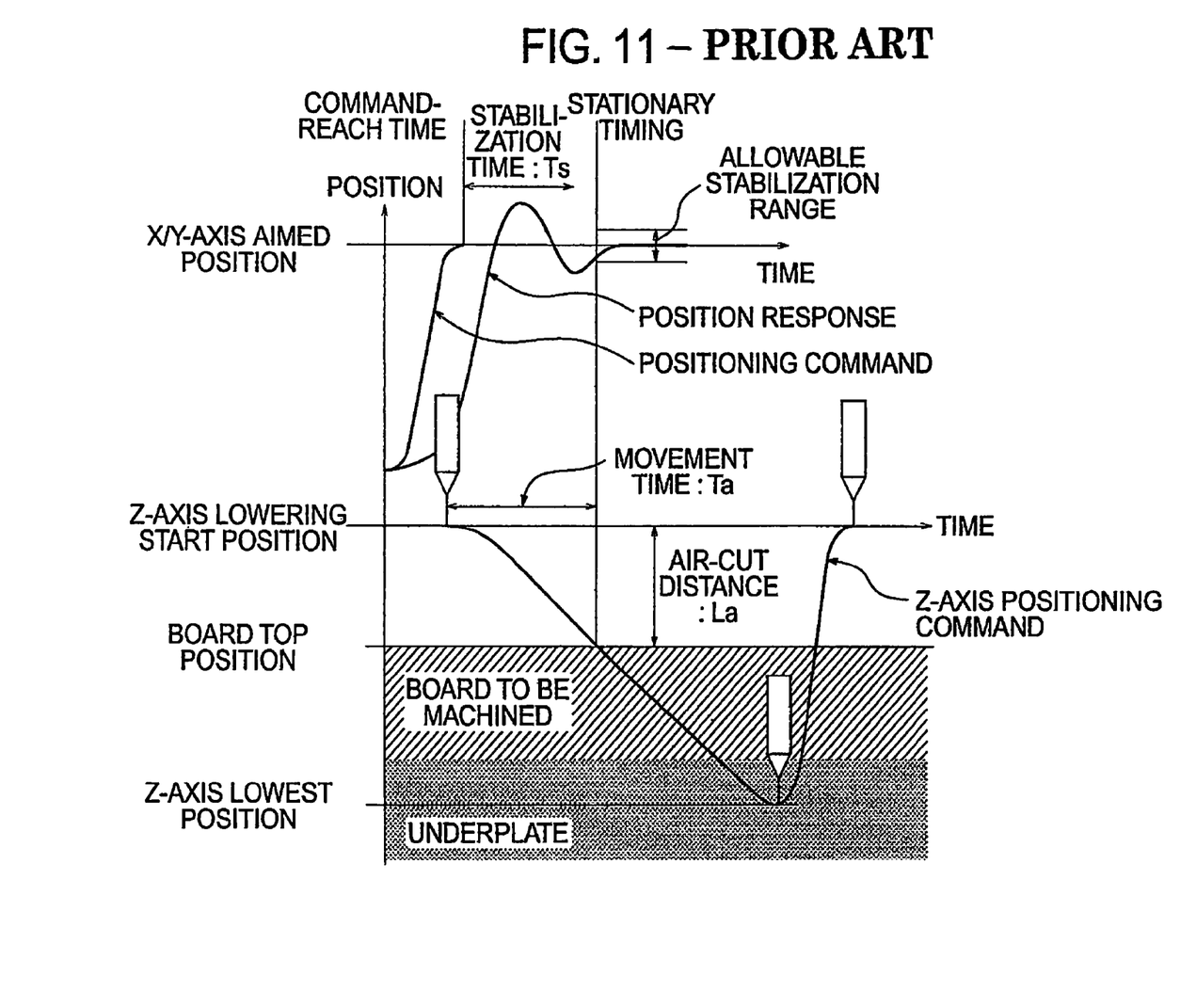
FIG. 11 is an explanatory diagram for explaining the related art.

FIG. 11 is an explanatory diagram of an invented machining procedure by which the machining speed can be improved. In order to shorten the machining time and improve the machining accuracy, the drill 4 may be made to cut into the printed board 1 as soon as the axis of the drill 4 is positioned on the axis (vertically above) of the drilling position 8, that is, as soon as the stabilization time Ts has passed, as shown in FIG. 11.

To this end, as disclosed in Japanese Patent Laid-Open No. 2002-166396, the present inventor proposed an invention in which the timing to position the axis of the drill 4 at a machining position is calculated from the movement distance, the velocity and the acceleration in the case where the table 2 and the drill 4 move in the X and Y directions, and the forward end of the drill 4 is made to reach the top of the printed wiring board synchronously with the end point of the stabilization time Ts.

According to this invention, when it is assumed that the velocity of the Z-axis drive unit 6 is fixed and there is no delay in position response of the Z-axis drive unit 6 with respect to a command given thereto, the movement time Ta for the drill 4 to reach the top of the board can be obtained from Equation 1 using the lowering velocity Vz and the air-cut distance La of the Z-axis drive unit 6.

$$Ta = La/Vz \qquad \text{Equation 1}$$

The lowering motion of the Z-axis drive unit 6 is started:

at the same time as the command-reach time of the X-axis when Ts=Ta;

after the time (Ts−Ta) has passed from the command-reach time of the X-axis when Ts>Ta; and the time (Ta−Ts) prior to the command-reach time of the X-axis when Ta>Ts.

Incidentally, for moving to the next machining position, the X-axis drive unit 3 and the Y-axis drive unit 7 are operated simultaneously. Therefore, the timing at which Z-axis operation is started is determined in accordance with the slower drive unit which will reach the next machining position slower.

However, the timing obtained in the aforementioned related art is a theoretical timing. A real machining apparatus has a variation in properties. In addition, even in the same machining apparatus, the properties may change, for example, owing to a movement direction, a movement start position, or the like. The properties may also change owing to the maintenance conditions or the environment where the apparatus is installed. Therefore, in order to keep high machining accuracy, it may be necessary to measure the drilling position accuracy in a really drilled printed wiring board. When such measurement is carried out, improvement in machining productivity cannot be expected owing to the measuring step.

SUMMARY OF THE INVENTION

In order to solve the foregoing problem belonging to the related art, it is an object of the invention to provide a machining method and a machining apparatus by which the measuring step can be omitted so that the machining productivity and the machining quality on a work can be improved.

In order to attain the foregoing object, according to an aspect of the invention, there is provided a machining method for positioning a work and a tool in directions of X-, Y- and Z-axes perpendicular to one another and machining the work, including the steps of: moving the work in each of the X- and Y-axis directions relatively to the Z-axis corresponding to an axis of the tool, prior to machining; examining positioning response properties of the X- and Y-axis directions with respect to the Z-axis; and positioning the tool in the Z-axis direction based on the obtained positioning response properties.

In this case, a plurality of measuring conditions for confirming the positioning response properties are established in advance. In addition, conditions clarifying the dependence on at least one of the movement start point, the movement direction, the movement velocity, the movement acceleration and the movement distance are selected as the measuring conditions. The positioning response properties used for positioning are selected from the obtained data in comparison between movement conditions to be used during machining and the measuring conditions. Incidentally, control parameters that can change the positioning response properties may be prepared in advance. In this case, the control parameters are changed when the obtained data is out of a predetermined range. Then, the positioning response properties are examined, and the tool is positioned in the axis direction based on the control parameters with which the obtained data is within the range.

In addition, at least one of a movement start time, a movement velocity and a movement start position with which the tool moves in the Z-axis direction is controlled based on the obtained positioning response properties. On that occasion, the movement start position may be established to be shorter than a predetermined air-cut distance by a distance Lc obtained from an equation:

$$Lc = Vz(Ta - Ts)$$

using a difference Tc between movement time Ta and stabilization time Ts and a lowering velocity Vz. That is, the movement start position is set in the position expressed by the air-cut distance (La) minus Lc so that the movement time can be shortened.

Further, an allowable range of stabilization may be established in accordance with machining accuracy. In this case, the positioning response properties of the X- and Y-axis directions with respect to the Z-axis are examined in the established allowable range of stabilization.

According to another aspect of the invention, there is provided a machining method for positioning a work and a tool in directions of X-, Y- and Z-axes perpendicular to one another and machining the work, including the steps of: setting an axis of the tool as the Z-axis, and obtaining a delay of Z-axis position response of a main shaft holding the tool, prior to machining; and setting a movement start time in the X- and Y-axes at a time point when time obtained by adding the delay of Z-axis position response of the main shaft to time required for a forward end of the tool inside the work to lift back to the surface of the work has passed since a time point when the forward end of the tool reached a cutting distance (cut-in end).

According to a further aspect of the invention, there is provided a machining apparatus including: moving means for moving a table and a main shaft relatively to each other in directions of X-, Y- and Z-axes perpendicular to one another, the table being mounted with a work, the main shaft holding a tool, the moving means being operated to machine the work; drive means for moving the work in each of the X-axis direction and the Y-axis direction relatively to the Z-axis corresponding to an axis of the tool, prior to machining; response property detecting means for examining positioning response properties of the X- and Y-axis directions with respect to the Z-axis; and positioning control means for positioning the tool in the Z-axis direction based on the obtained positioning response properties.

In addition, according to a still further aspect of the invention, there is provided a machining apparatus including: moving means for moving a table and a main shaft relatively to each other in directions of X-, Y- and Z-axes perpendicular to one another, the table being mounted with a work, the main shaft holding a tool, the moving means being operated to machine the work; program storage means for storing examination programs and machining programs; analyzing means for reading the programs from the storage means and analyzing the read programs; pattern storage means for storing a pattern and a stabilization time of predetermined moving operation; pattern matching judging means for judging matching between moving operation analyzed by the analyzing means and the moving operation stored in the pattern storage means; drive control means for moving the work and/or the tool in the X- and Y-axis directions; command creating means for creating a Z-axis lowering command to the drive control means; and response analyzing means for analyzing position response of the work and/or the tool in each of the axes driven by the drive control means; wherein prior to machining, the table and the tool are moved in two directions perpendicular to the Z-axis corresponding to the main shaft under specified measuring conditions, a stabilization time required until position response of the moving means reaches and stays within a predetermined allowable range is obtained after a command-reach time of a positioning command, and during machining, the tool is moved in the Z-axis direction based on the obtained stabilization time.

In this case, the machining apparatus may further include parameter storage means for storing a set of predetermined control parameters; wherein the drive control means acquires the control parameters from the parameter storage means, and moves the work and/or the tool in the X-axis direction and the Y-axis direction based on the control parameters.

In addition, the machining apparatus may further include control means for examining positioning response properties with respect to the two directions at the time of shipment, storing a stabilization time obtained thus into the pattern storage means, and comparing the stored stabilization time with a stabilization time examined after installation, so as to judge installation conditions. In this case, the machining apparatus is provided with a judgment function to judge installation conditions.

On that occasion, the control means may conclude that there is a trouble in a specific position of a base supporting the apparatus when the stabilization time varies widely in accordance with a coordinate value of a movement start point examined after installation. In addition, the control means may judge swinging of the apparatus based on the magnitude of overshoot/undershoot of a response waveform and the stabilization time examined after installation, so as to estimate the installation conditions and/or the floor rigidity.

Incidentally, for example, when a drill is used as the tool and a printed wiring board is used as the work, the machining method has a function as a printed wiring board drilling method, and the machining apparatus has a function as a printed wiring board drilling apparatus.

DESCRIPTION OF THE PREFERRED EMBODIMENT

The present invention will be described below based on an embodiment shown in the drawings.

Figure 1:
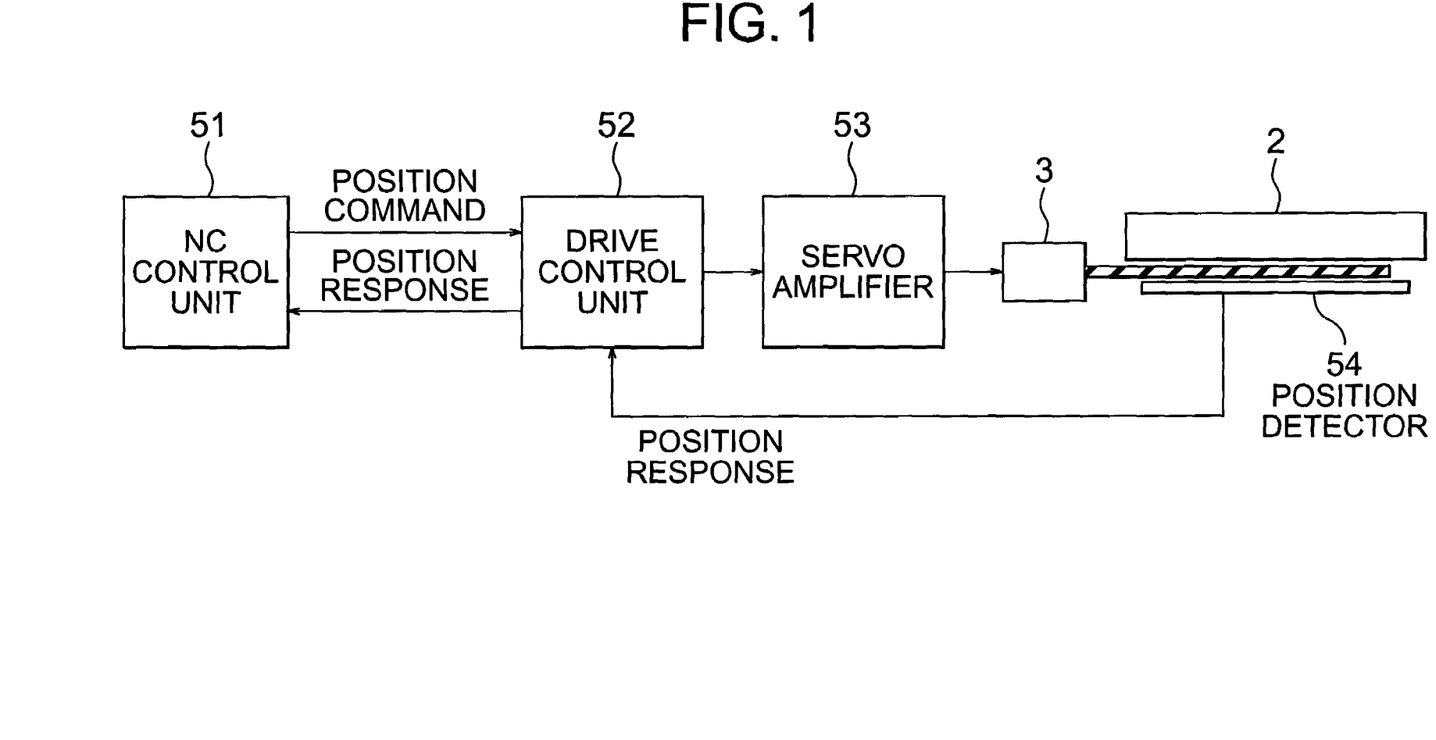
FIG. 1 is a connection diagram of an X-axis control apparatus according to the invention.
Figure 2:
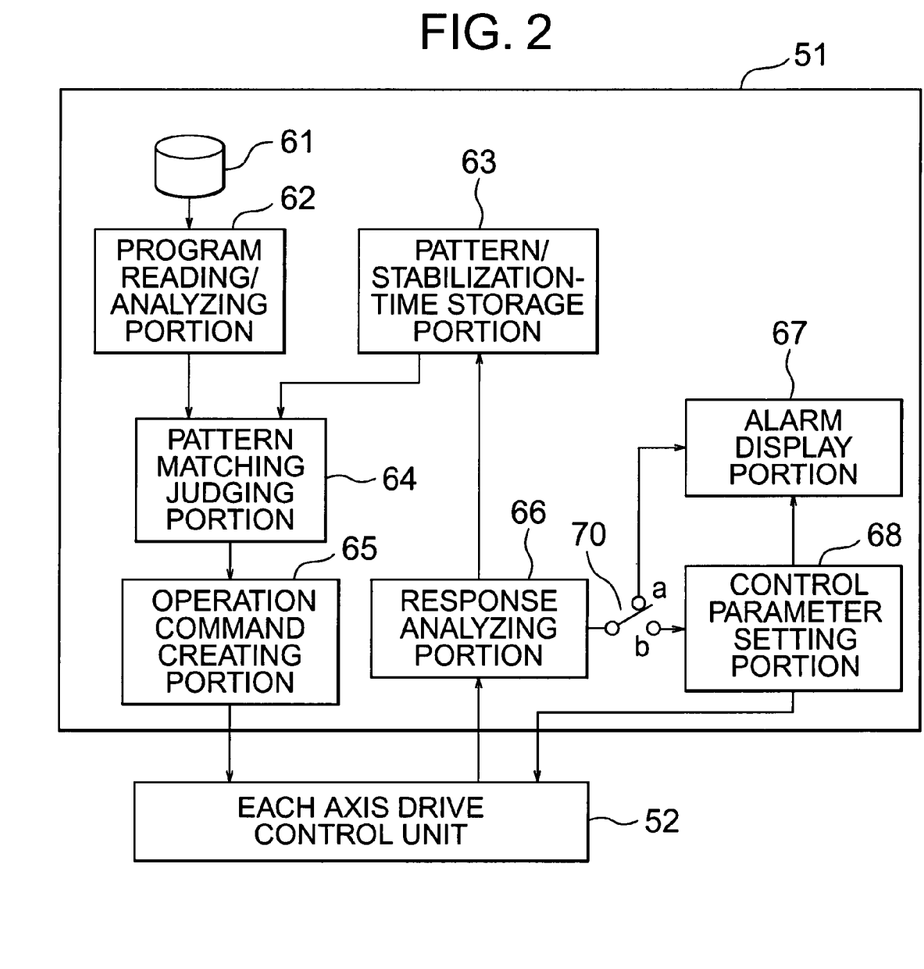
FIG. 2 is a processing block diagram of an NC control unit according to the invention.

FIG. 1 is a connection diagram of an X-axis control apparatus according to the invention, and FIG. 2 is a processing block diagram of an NC control unit according to the invention. In these drawings, parts equivalent to those in the conventional example shown in FIG. 8 are denoted by the same reference numerals correspondingly, and duplicate description of the these parts will be omitted.

In FIG. 1, the X-axis control apparatus is constituted by an NC control unit 51, a drive control unit 52 and a servo amplifier 53. The NC control unit 51 supplies a positioning command to the drive control unit 52 and receives a position response of a table 2 from the drive control unit 52. Based on the command from the NC control unit 51, the drive control unit 52 operates the X-axis drive unit 3 through the servo amplifier 53 so as to position the table 2. A position detector 54 supplies a current position of the table 2 to the drive control unit 52.

As shown in FIG. 2, the NC control unit 51 has a storage portion 61, a program reading/analyzing portion 62, a pattern/stabilization-time storage portion 63, a pattern matching judging portion 64, an operation command creating portion 65, a response analyzing portion 66, an alarm display portion 67, a control parameter setting portion 68, a switching portion 70, and so on. The storage portion 61 stores examination programs, machining programs for performing machining, and so on. In each of the examination programs, examination conditions which will be described later are written. The program reading/analyzing portion 62 reads the programs from the storage portion 61 and analyzes the read programs. The pattern/stabilization-time storage portion 63 stores a predetermined pattern of moving operation, and a stabilization time required since an X-axis positioning command reached an aimed position and till the X-axis drive unit 3 is stabilized within a predetermined allowable position error range. The pattern matching judging portion 64 judges matching between analyzed moving operation and the moving operation based on the examination conditions held in the pattern/stabilization-time storage portion 63. The operation command creating portion 65 creates a Z-axis lowering command to the drive control unit 52 operating the X-axis drive unit 3. The response analyzing portion 66 analyzes response of the X-axis drive unit 3. The alarm display portion 67 displays a predetermined alarm. The control parameter setting portion 68 stores a set of predetermined control parameters. The switching portion 70 switches the connection of the response analyzing portion 66 to the alarm display portion 67 or to the control parameter setting portion 68.

The NC control unit 51 configured thus performs operation as shown in the following Steps 1 to 8. Here, it is assumed that the a side of the switching portion 70 is connected.

Step 1:

In response to a machining command, the NC control unit 51 reads an examination program supplied beforehand from the storage portion 61 and stored. The NC control unit 51 makes the operation command creating portion 65, through the pattern matching judging portion 64, create a command to the drive control unit 52 so as to operate the X-axis drive unit 3 via the servo amplifier 53. For example, as shown in Table 1, the examination program specifies factors affecting properties at the time of stopping, such as a velocity, an acceleration, a movement direction, a movement start coordinate value, a stop position coordinate value, and the like, for each of the X-axis drive unit 3 and the Y-axis drive unit 7. Incidentally, the acceleration is omitted in Table 1 because the acceleration may be set as a fixed value.

TABLE 1

| examination conditions | X-axis velocity [m/min] | movement direction | movement start coordinate value | stop position coordinate value |
|---|---|---|---|---|
| 1 | 30 | + | 0 | 1 |
| 2 | 30 | + | 0 | 5 |
| 3 | 30 | + | 0 | 10 |
| 4 | 30 | + | 0 | 20 |
| 5 | 40 | + | 0 | 1 |
| 6 | 40 | + | 0 | 5 |
| 7 | 40 | + | 0 | 10 |
| 8 | 40 | + | 0 | 20 |
| 9 | 30 | − | 100 | 80 |
| 10 | 30 | − | 100 | 50 |
| . | . | . | . | . |
| . | . | . | . | . |
| . | . | . | . | . |

Step 2:

When one examination program has been executed, the NC control unit 51 makes the response analyzing portion 66 analyze the response (position response) of the X-axis drive unit 3 and calculate a stabilization time Ts. For example, the stabilization time Ts is calculated in the following method. That is, stabilization is judged based on whether a position deviation has stayed within a predetermined allowable range for a predetermined time. Thus, the time required from the command-reach time, on which the positioning command signal reaches the value determined from the aimed position, and till the position deviation entered the predetermined allowable range is counted as the stabilization time Ts. Incidentally, when the stabilization time Ts calculated by the response analyzing portion 66 and the magnitude of overshoot or undershoot of a response waveform described in FIG. 9 exceed their predetermined threshold values, an alarm is displayed by the alarm display portion 67 so as to notify a worker of the fact that the apparatus is out of order.

Step 3:

A set of the examination conditions and the obtained stabilization-time Ts are stored into the pattern/stabilization-time storage portion 63.

Step 4:

When there remain other examination conditions, the operation from Step 1 to Step 3 is repeated, and a set of the examination conditions and an obtained stabilization time Ts are stored into the pattern/stabilization-time storage portion 63.

When the operation till here is accomplished, real machining is started.

Step 5:

Next, the NC control unit 51 reads a real machining program from the storage portion 61, and makes the program reading/analyzing portion 62 analyze the contents of the read machining program.

Step 6:

The NC control unit 51 makes the pattern matching judging portion 64 judge matching between analyzed moving operation and moving operation based on the examination conditions held by the pattern/stabilization-time storage portion 63. Thus, a stabilization time Ts of consistent or closest examination conditions is read from the pattern/stabilization-time storage portion 63.

Step 7:

The NC control unit 51 makes the operation command creating portion 65 obtain a board top arrival time Ta of the drill 4 from Equation 1 using the air-cut distance La and the Z-axis lowering velocity Vz, calculate an optimal Z-axis lowering timing t using the stabilization time Ts read from the storage portion 63, and create a command to the drive control unit 52.

Step 8:

The drive control unit 52 operates the X-axis drive unit 3 in accordance with the instruction created in Step 7.

The operation from Step 5 to Step 8 is repeated till machining is finished.

On the other hand, when the side b of the switching portion 70 is connected, that is, when the control parameter setting portion 68 is connected, operation is performed as follows.

When the control parameter setting portion 68 is connected to the response analyzing portion 66, no alarm is displayed on the alarm display portion 67, but a set of control parameters stored beforehand in the control parameter setting portion 68 are selected. Control parameters set currently in the drive control unit 52 are replaced by the selected control parameters. After that, Steps 1 and 2 are performed again to observe a response waveform under the selected control parameters. When there is a set of parameters with which the magnitude of overshoot and undershoot of the response waveform and so on will be within their predetermined threshold values, machining is performed using the selected control parameters. When a desired result cannot be obtained, other control parameters are selected. When there is no proper set of parameters even if such an operation is repeated, there has occurred something out of order in the apparatus, or the conditions of installation of the apparatus have deteriorated. Thus, the NC control unit 51 makes the alarm display portion 67 display an alarm to make a notification that the apparatus is out of order.

The Z-axis drive unit 6 operates as follows. Incidentally, FIGS. 3 to 7 are explanatory diagrams showing the position of the drill with the abscissa designating the temporal axis.

Figure 3:
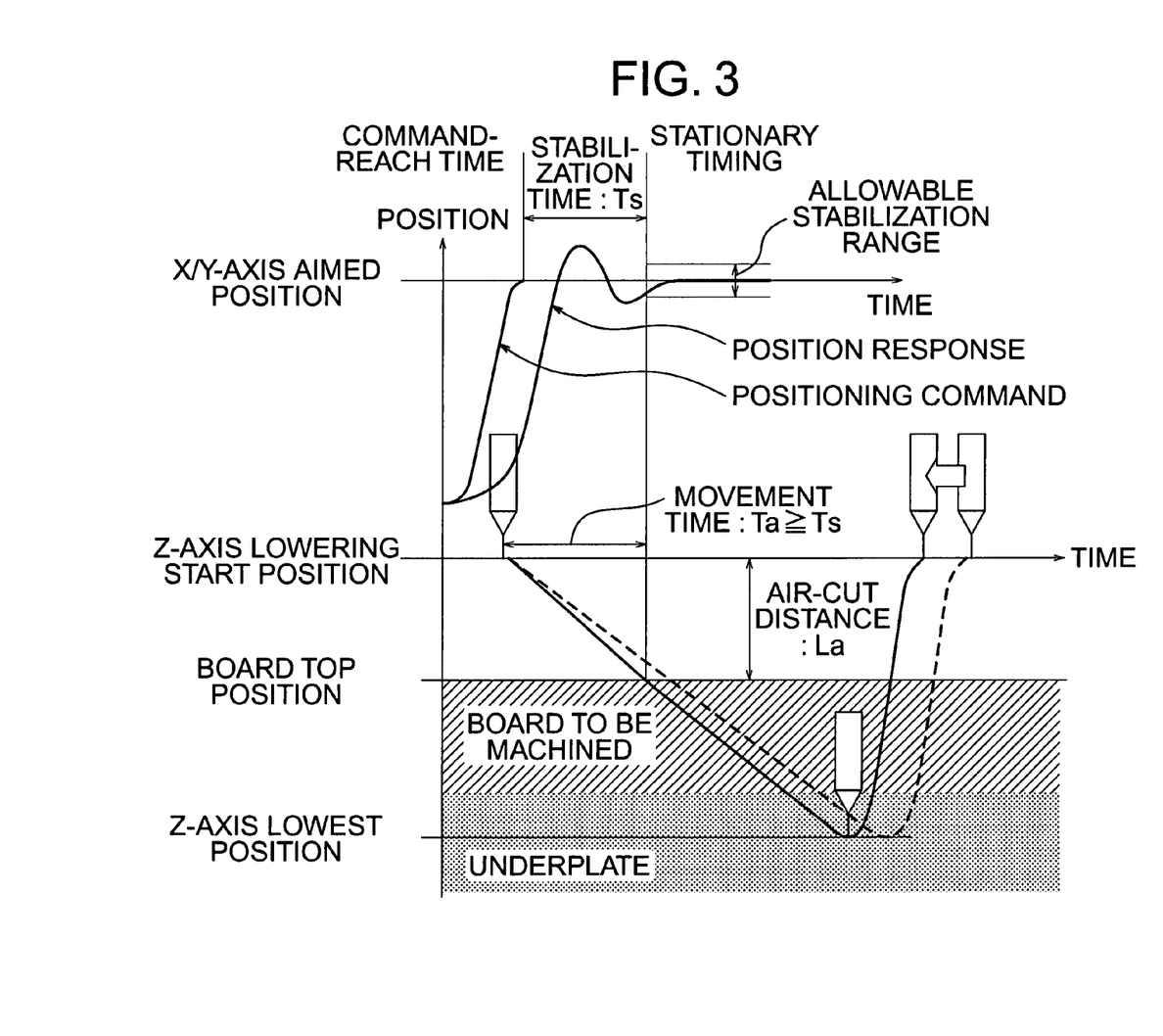
FIG. 3 is a diagram showing the relationship between a drill and an X-axis moving unit according to the invention.

Embodiment 1: In Case of Board Top Arrival Time Ta of Drill 4>Stabilization Time Ts In the related art, the drill lowers in velocity Vz as shown by the broken line in FIG. 3. On the other hand, according to the present invention, the drill 4 is moved down in velocity Vz1 (Vz1>Vz) obtained by the following equation 2, as shown by the solid line in FIG. 3.

$$Vz1 \geq La/Ts \quad \text{Equation 2}$$

Thus, the machining productivity can be improved.

Figure 4:
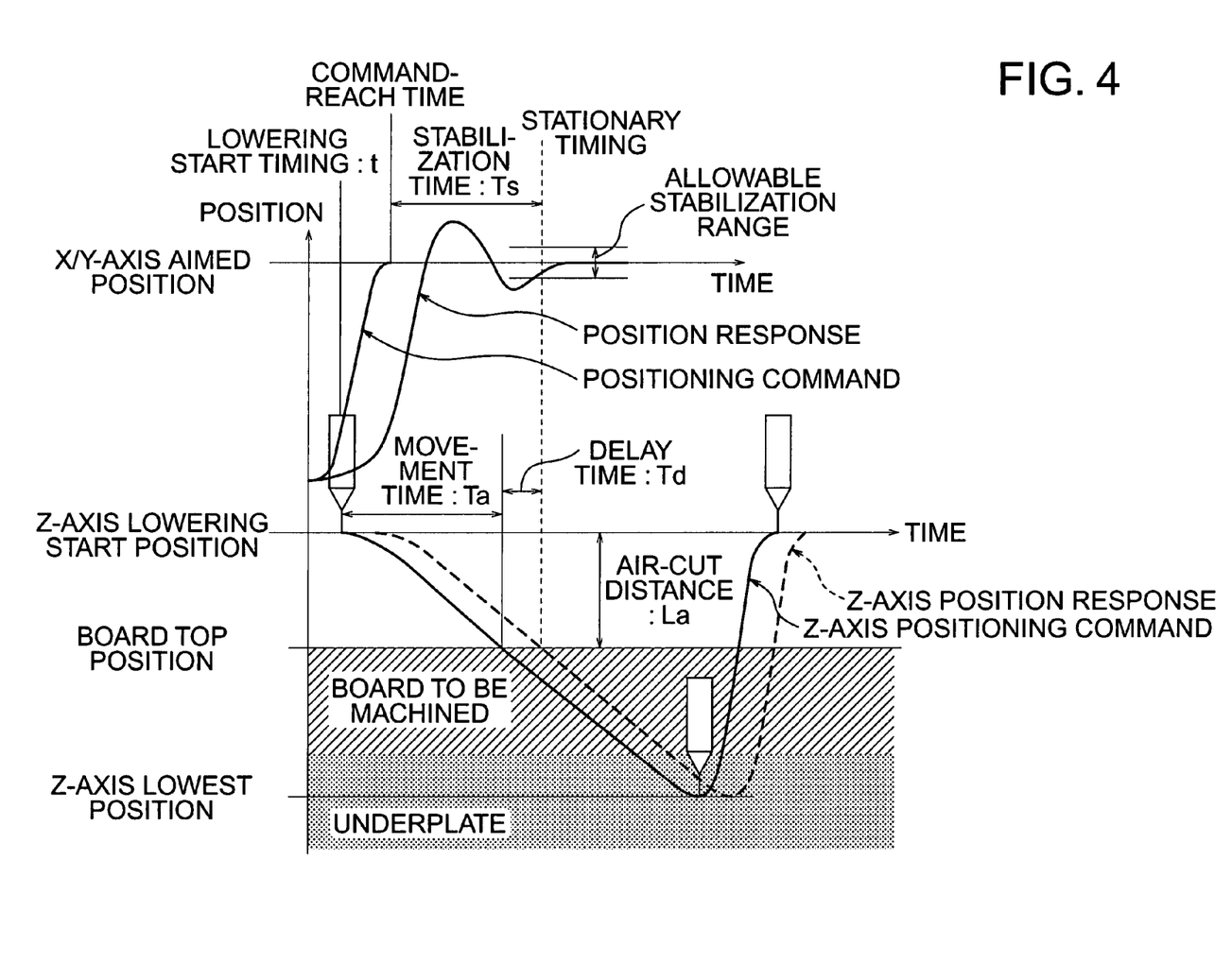
FIG. 4 is a diagram showing the relationship between the drill and the X-axis moving unit according to the invention.

Incidentally, it is assumed in FIG. 3 that there is no delay of response in the Z-axis drive unit 6. In fact, however, there is a delay of response also in the Z-axis drive unit 6. Therefore, as shown in FIG. 4, an optimal Z-axis lowering timing t is calculated based on the value obtained by adding a delay time Td to the movement time Ta obtained in Step 7, and the drill is moved down at the calculated timing t. Thus, the machining productivity can be improved without lowering the machining accuracy.

Figure 5:
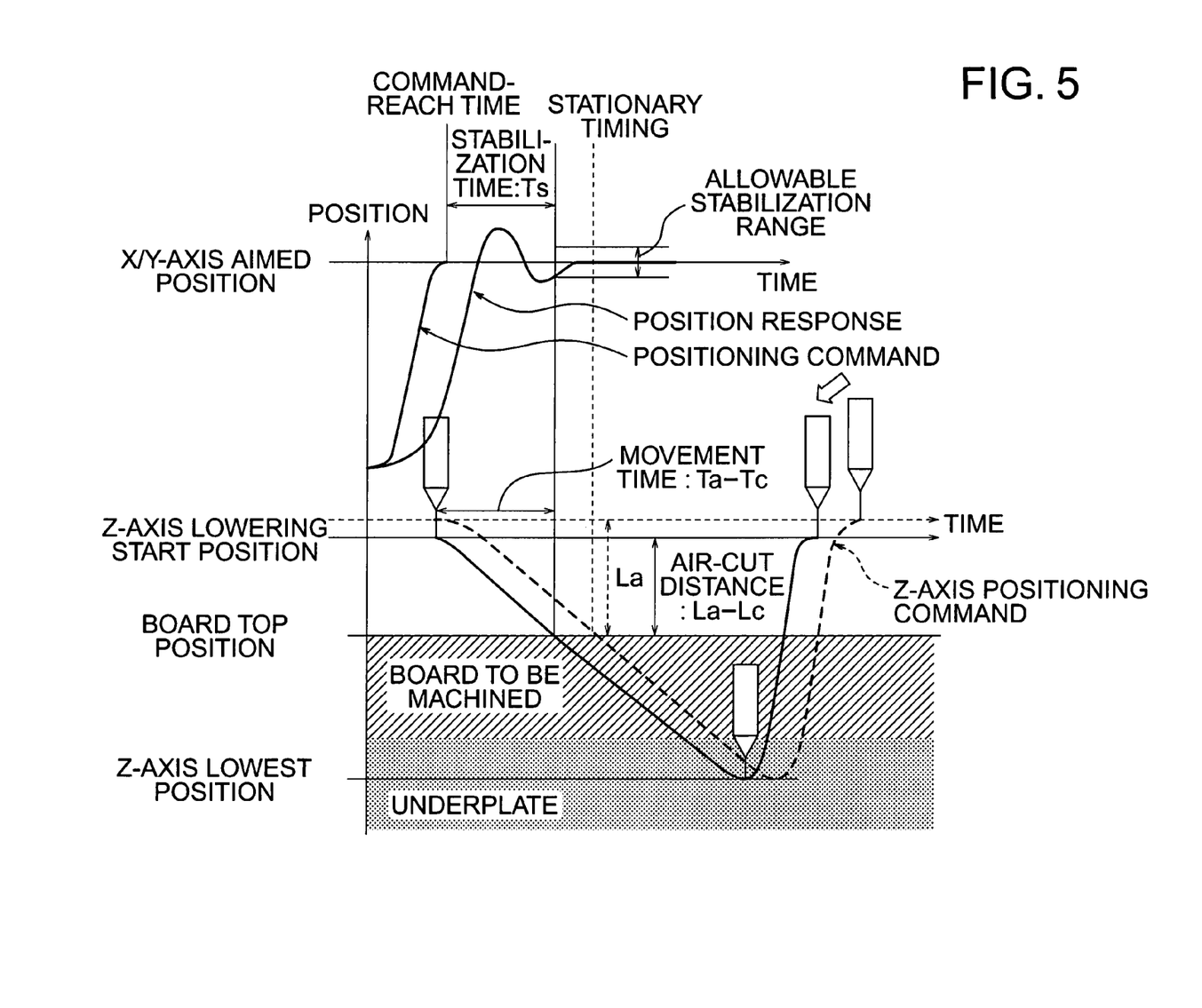
FIG. 5 is a diagram showing the relationship between the drill and the X-axis moving unit according to the invention.

Alternatively, without changing the lowering velocity of the drill 4, a difference Tc between the movement time Ta and the stabilization time Ts is obtained from the following equation 3, and the air-cut distance La is shortened by the distance Lc as shown by the solid line in FIG. 5. Then, the drill is moved down at that position. In such a manner, the machining productivity can be improved in comparison with that in the related art shown by the broken line in FIG. 5.

$$Lc=Vz(Ta-Ts) \quad \text{Equation 3}$$

Embodiment 2: In Case that Machining Accuracy is Required

Figure 6:
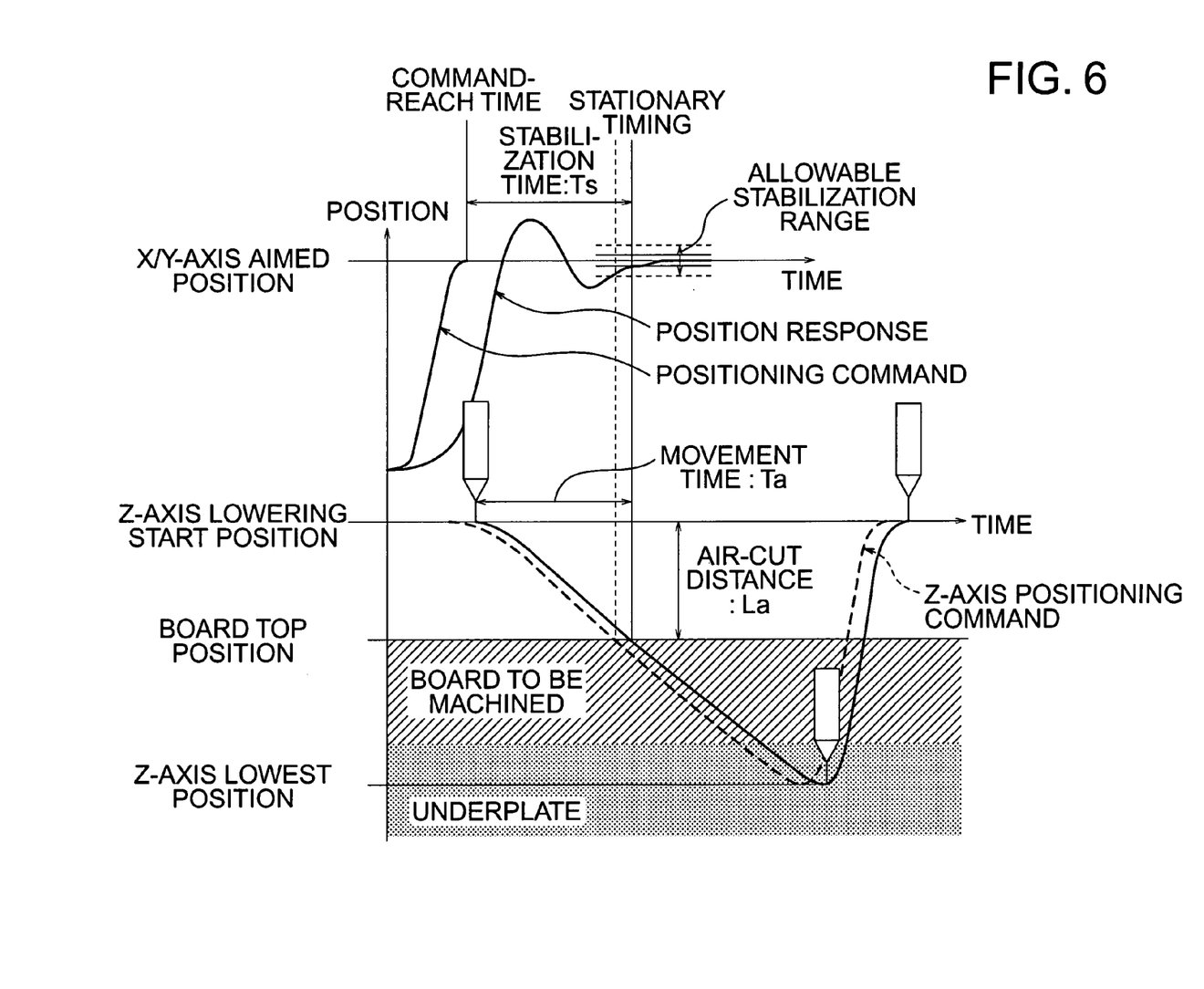
FIG. 6 is a diagram showing the relationship between the drill and the X-axis moving unit according to the invention.
Figure 7:
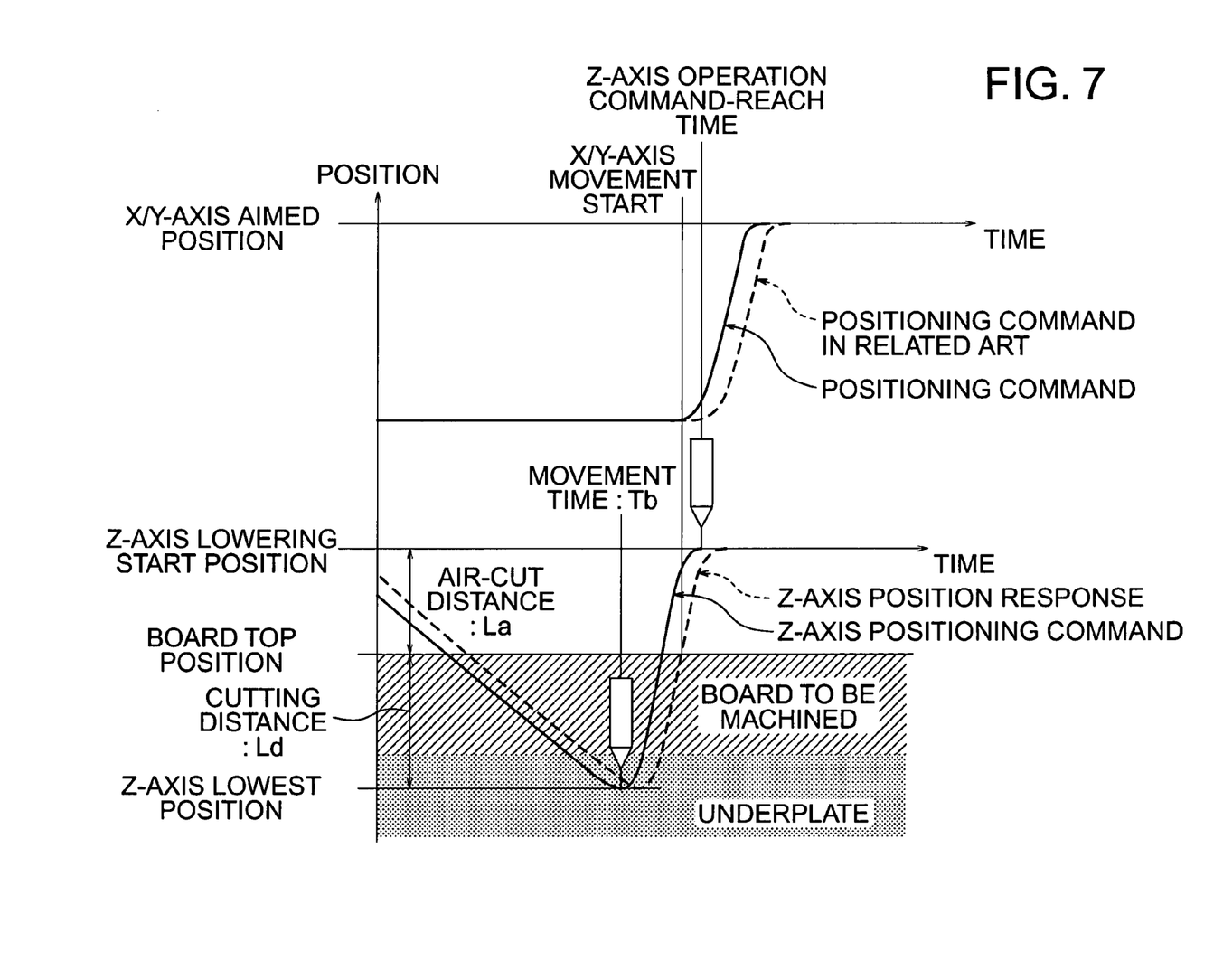
FIG. 7 is a diagram showing the relationship between the drill and the X-axis moving unit according to the invention.

When high machining accuracy is required, the allowable stabilization range is narrowed in advance as shown by the solid line in FIG. 6. Then, the stabilization time Ts is observed in this state. Thus, the machining productivity can be improved while the machining accuracy is improved.

On the contrary, when the machining accuracy is not required that high, the allowable stabilization range is widened in advance as shown by the broken line in FIG. 6. Thus, the machining productivity can be improved.

Conventionally, the time for the drill 4 to escape from the board has not been taken into consideration. However, when the X-axis drive unit 3 and the Y-axis drive unit 7 are operated as soon as the drill 4 escapes from the board, the machining productivity can be improved.

In this embodiment, when the stabilization time Ts calculated in Step 2 and the magnitude of overshoot or undershoot of the response waveform are out of their predetermined threshold values, the worker is notified of the fact that the apparatus is out of order. It is therefore possible to prevent a failure in machining from occurring.

Next, description will be made on the case where the X-axis moving unit and the Y-axis moving unit are controlled with reference to the operation of the Z-axis moving unit.

At the time of machining, the time for the drill 4 to rise to the surface of the printed wiring board from the position where the drill 4 reaches the machining depth is calculated with reference to the output of the position detector detecting the position of the Z-axis drive unit 6 (or the main shaft holding the drill). At the same time, the delay of response of the Z-axis drive unit 6 is obtained based on the position response of the Z-axis drive unit. Then, as shown by the solid line in FIG. 7, the X-axis drive unit 3 and the Y-axis drive unit 7 are operated as soon as there has passed the time obtained by adding the delay of response of the Z-axis drive-unit to the time for the forward end of the drill 4 to lift back to the surface of the printed wiring board from the time point when the forward end of the drill 4 reaches the cutting distance Ld from the surface of the printed wiring board.

In such a manner, the X-axis drive unit 3 and the Y-axis drive unit 7 are operated in the state where the drill 4 has been completely separated from the printed wiring board 1. It is therefore possible to prevent the drill 4 from being broken, while it is possible to improve the machining productivity in comparison with that in the related art shown by the broken line in FIG. 7.

Incidentally, not only can the present invention improve the machining accuracy and the machining speed, but the invention is also effective in the following case.

That is, the stabilization time Ts obtained at the time of installation is compared with a stabilization time Ts measured before hand at the time of shipment. In such a manner, the quality of the installation conditions can be judged. This judgment is, for example, performed by the pattern matching judging portion 64. Incidentally, the judgment may be made by a not-shown CPU of the NC control unit.

In addition, when the stabilization time Ts varies widely in accordance with the coordinate value of the movement start point, it can be concluded easily that there is a trouble in a specific position of a base supporting the apparatus.

Further, it is possible to judge swinging of the apparatus from the magnitude of overshoot/undershoot of the response waveform and the stabilization time Ts. Thus, it is also possible to estimate the installation conditions or the floor rigidity.

Incidentally, the present invention is also applicable to a machining apparatus in which a table is moved in the two, X- and Y-directions.

As described above, according to the invention, a machining apparatus is operated actually under predetermined conditions prior to machining. Thus, the current conditions of the machining apparatus can be grasped properly. Machining operation is performed based on the obtained result. Accordingly, without necessity of measuring the drilling position accuracy, it is possible to attain high-speed and high-accuracy machining.

In addition, it is possible to detect the deterioration of accuracy or the change of setting conditions caused by the setting conditions at the time of installation, aged deterioration, and so on. Thus, not only is it possible to prevent a failure in machining from occurring, but the maintenance performance is also improved.

What is claimed is:

1. A machining method for positioning a work and a tool in directions of X-, Y- and Z-axes perpendicular to one another and machining said work, comprising the steps of:
   obtaining positioning response data until stabilizing a position deviation within a predetermined allowable range from a command-reach time after moving said work in each of said X- and Y- axis directions relative to said Z-axis corresponding to an axis of said tool, prior to machining; and
   determining a lowering timing of movement of said tool in said Z-axis direction based on said obtained positioning response data.

2. A machining method according to claim 1, wherein a plurality of examination conditions for movement in said X- and Y-axis directions for obtaining said positioning response data are predetermined.

3. A machining method according to claim 2, wherein said examination conditions clarify the dependence of at least one of a movement start point, a movement direction, a movement velocity, a movement acceleration and a movement distance.

4. A machining method according to claim 2, wherein positioning response data to be used during machining are selected from said obtained positioning response data in comparison between movement conditions to be used during machining and said predetermined examination conditions.

5. A machining method according to claim 1, wherein control parameters for movement in said X- and Y-axis directions that can change said positioning response properties are prepared in advance, and such control parameters that said obtained positioning response data are within a predetermined range are used, or if said obtained positioning response data are not with said predetermined range, obtaining positioning response data is repeated by changing said control parameters until said obtained positioning response data are within said predetermined range.

6. A machining method according to claim 1, wherein at least one of a movement start time, a movement velocity and a movement start position with which said tool moves in said Z-axis direction is controlled based on said obtained positioning response data.

7. A machining method according to claim 6, wherein said movement start position is set to be shorter than a predetermined air-cut distance by a distance Lc obtained from an equation:

$$Lc=Vz(Ta-Ts)$$

using movement time Ta, stabilization time Ts and a lowering velocity Vz.

8. A machining method according to claim 1, wherein an allowable range of stabilization is set in accordance with machining accuracy, and said positioning response data in each of said X- and Y-axis directions with respect to said Z-axis are examined in said allowable range of stabilization.

9. A machining method for positioning a work and a tool in directions of X-, Y- and Z-axes perpendicular to one another and machining said work, comprising the steps of:
   setting an axis of said tool as said Z-axis, and obtaining a delay of Z-axis position response of a main shaft holding said tool, prior to machining; and
   setting a movement start time for said X- and Y-axes at a time point when time obtained by adding said delay of Z-axis position response of said main shaft to a command time required from a forward end of said tool inside said work to a surface of said work has passed from a time point when said forward end of said tool reached a cutting distance.

10. A machining method according to any one of claims 1 to 9, wherein said tool is a drill.

11. A processing method according to any one of claims 1 to 9, wherein said work is a printed wiring board.

12. A machining apparatus comprising:
moving means for moving a table and a main shaft relatively to each other in directions of X-, Y- and Z-axes perpendicular to one another, said table being mounted with a work, said main shaft holding a tool, said moving means being operated to machine said work;
drive means for moving said work in each of said X-axis direction and said Y-axis direction relatively to said Z-axis corresponding to an axis of said tool, prior to machining;
response property detecting means for obtaining positioning response data until stabilizing a position deviation within a predetermined allowable range from a command-reach time after moving said work in each of said X- and Y-axis directions with respect to said Z-axis corresponding to an axis of said tool, prior to machining; and
positioning control means for determining a lowering timing of movement of said tool in said Z-axis direction based on said obtained positioning response data.

13. A machining apparatus comprising:
moving means for moving a table and a main shaft relatively to each other in directions of X-, Y- and Z-axes perpendicular to one another, said table being mounted with a work, said main shaft holding a tool, said moving means being operated to machine said work;
program storage means for storing examination programs and machining programs;
analyzing means for reading said machining programs from said storage means and analyzing said programs;
pattern storage means for storing a pattern and a stabilization time of predetermined moving operation;
pattern matching judging means for judging matching between moving operation analyzed by said analyzing means and said moving operation stored in said pattern storage means;
drive control means for moving said work and/or said tool in said X- and Y-axis directions;
command creating means for creating a Z-axis lowering command to said drive control means; and
response analyzing means for analyzing position response of said work and/or said tool in each of said axes driven by said drive control means;
wherein prior to machining, said table and said tool are moved in two directions perpendicular to said Z-axis corresponding to said main shaft under specified examination conditions, a stabilization time required until position response of said moving means reaches and stays within a predetermined allowable range is obtained after a command-reach time of a positioning command, and at the time of machining, said tool is moved in said Z-axis direction based on said obtained stabilization time.

14. A machining apparatus according to claim 12 or 13, further comprising:
parameter storage means for storing a set of predetermined control parameters;
wherein said drive control means acquires said control parameters from said parameter storage means, and moves said work and/or said tool in said X-axis direction and said Y-axis direction based on said control parameters.

15. A machining apparatus according to claim 13, further comprising control means for examining positioning response properties with respect to said X- and Y-axis directions at a time of shipment, storing said stabilization time obtained thus into said pattern storage means, and comparing said stored stabilization time with a stabilization time examined after installation, so as to judge installation conditions.

16. A machining apparatus according to claim 15, wherein said control means concludes that there is a trouble in a specific position of a base supporting said apparatus when said stabilization time varies widely in accordance with a coordinate value of a movement start point examined after installation.

17. A machining apparatus according to claim 16, wherein said control means judges swinging of said apparatus based on magnitude of overshoot/undershoot of a response waveform and said stabilization time examined after installation, so as to estimate installation conditions and/or floor rigidity.

18. A machining apparatus according to claim 12 or 13, wherein said tool is a drill.

19. A machining apparatus according to claim 12 or 13, wherein said work is a printed wiring board.

* * * * *